United States Patent
Nguyen et al.

(10) Patent No.: US 10,038,041 B2
(45) Date of Patent: Jul. 31, 2018

(54) DISPLAY DEVICE AND METHOD OF MANUFACTURING THE SAME

(71) Applicant: Samsung Display Co., Ltd., Yongin-si, Gyeonggi-do (KR)

(72) Inventors: Thanh Tien Nguyen, Seoul (KR); Min-Sung Kim, Hwaseong-si (KR); Jae Seob Lee, Seoul (KR); Ki Ju Im, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 4 days.

(21) Appl. No.: 15/261,787

(22) Filed: Sep. 9, 2016

(65) Prior Publication Data

US 2017/0077199 A1    Mar. 16, 2017

(30) Foreign Application Priority Data

Sep. 14, 2015  (KR) ........................ 10-2015-0129548

(51) Int. Cl.
*H01L 27/32* (2006.01)
*H01L 51/00* (2006.01)
*G09G 3/3225* (2016.01)

(52) U.S. Cl.
CPC ...... *H01L 27/3258* (2013.01); *H01L 51/0097* (2013.01); *G09G 3/3225* (2013.01); *G09G 2300/0426* (2013.01); *G09G 2300/0819* (2013.01); *G09G 2300/0852* (2013.01); *G09G 2300/0861* (2013.01); *G09G 2310/0262* (2013.01); *G09G 2380/02* (2013.01); *Y02E 10/549* (2013.01)

(58) Field of Classification Search
CPC ............ H01L 27/3258; H01L 51/0097; H01L 2227/323; H01L 27/32; H01L 51/00; G09G 3/3225; G09G 2300/0426; G09G 2300/0852; G09G 2300/0861; G09G 2310/0262; G09G 2380/02; G09G 2300/0819; Y02E 10/549
See application file for complete search history.

(56) References Cited

U.S. PATENT DOCUMENTS

| | | | |
|---|---|---|---|
| 2015/0103298 A1* | 4/2015 | Lee ................... | G02F 1/133351 349/123 |
| 2015/0116619 A1* | 4/2015 | Yi ....................... | G02B 27/2214 349/43 |
| 2015/0116648 A1* | 4/2015 | Shin ..................... | G02B 5/0242 349/176 |

FOREIGN PATENT DOCUMENTS

| | | |
|---|---|---|
| JP | 2001-305551 A | 10/2001 |
| JP | 2011-027822 A | 2/2011 |
| KR | 10-2011-0072269 A | 10/2011 |
| KR | 2014-0042553 A | 4/2014 |

* cited by examiner

*Primary Examiner* — Thanh T Nguyen
(74) *Attorney, Agent, or Firm* — Knobbe Martens Olson & Bear LLP

(57) ABSTRACT

A display device and a method of manufacturing the same are disclosed. In one aspect, the display device includes a flexible substrate, a thin film transistor (TFT) disposed over the flexible substrate, a first electrode disposed over the TFT, and a second electrode disposed over the first electrode. The flexible substrate includes a first incompressible liquid layer.

17 Claims, 16 Drawing Sheets

DISPLAY DEVICE AND METHOD OF MANUFACTURING THE SAME

CROSS-REFERENCE TO RELATED APPLICATION

This application claims priority to and the benefit of Korean Patent Application No. 10-2015-0129548 filed in the Korean Intellectual Property Office on Sep. 14, 2015, the entire contents of which are incorporated herein by reference.

BACKGROUND

Field

The described technology generally relates to a display device and a method of manufacturing the same.

Description of the Related Technology

The display industry has rapidly developed information providing devices such as a display device, and recently, many technical challenges have arisen in terms of weight and thickness of the display device.

Among flat panel displays, liquid crystal displays (LCDs) have been widely used. However, since the LCD is a non-emissive display device, there is a drawback in that a separate light source such as a backlight is required.

Recently, an organic light-emitting diode (OLED) received much attention. The OLED includes two electrodes facing each other, and an organic layer interposed between the electrodes. If holes injected from an anode and electrons injected from a cathode meet each other at a light emitting layer to generate an exciton and the exciton is subjected to photo-luminescence quenching, light is generated. The OLED can be applied to various fields including display devices and lighting devices.

A bendable OLED display can be manufactured with a flexible substrate. In this case, wiring can be disconnected and/or characteristics can be deteriorated due to stress in the layers of the OLED display.

The above information disclosed in this Background section is only for enhancement of understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to an OLED display that can be bent without deterioration of characteristics thereof.

Another aspect is a display device including: a flexible substrate, a thin film transistor disposed on the flexible substrate, a first electrode disposed on the thin film transistor, and a second electrode disposed on the first electrode, wherein the flexible substrate includes a first incompressible liquid layer.

The display device can include a plurality of pixel areas including the first electrode, wherein the first incompressible liquid layer can be disposed at a position corresponding to one of the plurality of pixel areas.

The first incompressible liquid layer can be disposed at a position corresponding to the thin film transistor.

The display device can include an organic emission layer disposed between the first electrode and the second electrode.

The display device can include one or more insulating layers disposed on the flexible substrate, wherein at least one the insulating layers can include a second incompressible liquid layer.

The display device can include plurality of pixel areas including the first electrode, wherein the first incompressible liquid layer and the second incompressible liquid layer can be respectively disposed at a position corresponding to one of the plurality of pixel areas.

The first incompressible liquid layer and the second incompressible liquid layer can be disposed at a position corresponding to the thin film transistor.

The second incompressible liquid layer can be disposed at a position corresponding to the second incompressible liquid layer.

The display device can include a data line connecting with the thin film transistor and extending in one direction, wherein the one or more insulating layers can include a passivation layer disposed on the data line and an insulating layer disposed below the data line, and wherein at least one of the passivation layer and the insulating layer can include the second incompressible liquid layer.

The insulating layer can include a plurality of separation grooves that separate the adjacent pixel areas and are extended in a direction perpendicular to the data line, and the separation groove can be filled with a filling member.

The display device can be bent in one direction.

The flexible substrate can include a polyimide.

The passivation layer can include the second incompressible liquid layer, wherein the second incompressible liquid layer can includes one or more patterns corresponding to a contact hole formed on the passivation layer.

The insulating layer can include the second incompressible liquid layer, wherein the second incompressible liquid layer can include one or more patterns corresponding to a contact hole formed on the passivation layer.

Another aspect is a display device including: a flexible substrate; a thin film transistor disposed on the flexible substrate; an insulating layer disposed on the thin film transistor; a first electrode disposed on the insulating layer; and a second electrode disposed on the first electrode, wherein the insulating layer includes a first incompressibility liquid layer.

The display device can include a plurality of pixel areas including the first electrode, wherein the first incompressible liquid layer can be disposed at a position corresponding to one of the plurality of pixel areas.

The first incompressible liquid layer can be disposed at a position corresponding to the thin film transistor.

Another aspect is a manufacturing method of a display device, including: forming a substrate including an incompressible liquid layer; forming a thin film transistor on the substrate; forming a first electrode on the thin film transistor; and forming a second electrode on the first electrode, wherein the forming a substrate includes, forming a first layer including a polyimide, of etching the first layer, injecting an incompressible liquid in the etched portion of the first layer, and depositing a second layer including a polyimide on the first layer.

The etching of the first layer can include etching a position of the first layer corresponding to the thin film transistor.

The injecting of the incompressible liquid in the etched portion of the first layer can uses an injection printing method.

According to at least one of the disclosed embodiments, as resistance to deformation increases, the display device can be bent without deterioration or damage, and maintain stable performance.

Another aspect is a display device comprising: a flexible substrate; a thin film transistor (TFT) disposed over the flexible substrate; a first electrode disposed over the TFT; and a second electrode disposed over the first electrode, wherein the flexible substrate comprises a first incompressible liquid layer.

The above display device further comprises a plurality of pixel areas comprising the first electrode, wherein the first incompressible liquid layer is disposed in one of the pixel areas.

In the above display device, the first incompressible liquid layer is disposed over the TFT.

The above display device further comprises an organic emission layer disposed between the first and second electrodes.

The above display device further comprises one or more insulating layers disposed over the flexible substrate, wherein at least one of the insulating layers comprises a second incompressible liquid layer.

The above display device further comprises a plurality of pixel areas comprising the first electrode, wherein the first and second incompressible liquid layers are disposed over one of the pixel areas.

In the above display device, the first and second incompressible liquid layers are disposed over the TFT.

In the above display device, the first incompressible liquid layer is disposed over the second incompressible liquid layer.

The above display device further comprises a data line connected to the TFT and extending in a first direction, wherein the insulating layers comprise a passivation layer disposed over the data line and an insulating layer disposed below the data line, and wherein at least one of the passivation layer and the insulating layer comprise the second incompressible liquid layer.

In the above display device, the insulating layer comprises a plurality of separation grooves that separate adjacent pixel areas and extend in a second direction crossing the data line, wherein the separation groove is filled with a filling member.

In the above display device, the display device is bent in the first direction.

In the above display device, the flexible substrate is formed of a polyimide.

In the above display device, the passivation layer comprises the second incompressible liquid layer, wherein the second incompressible liquid layer comprises one or more patterns corresponding to a contact hole formed in the passivation layer.

In the above display device, the insulating layer comprises the second incompressible liquid layer, wherein the second incompressible liquid layer comprises one or more patterns corresponding to a contact hole formed in the passivation layer.

Another aspect is a display device comprising: a flexible substrate; a thin film transistor (TFT) disposed over the flexible substrate; an insulating layer disposed over the TFT; a first electrode disposed over the insulating layer; and a second electrode disposed over the first electrode, wherein the insulating layer comprises a first incompressible liquid layer.

The above display device further comprises a plurality of pixel areas comprising the first electrode, wherein the first incompressible liquid layer is disposed over one of the pixel areas.

In the above display device, the first incompressible liquid layer is disposed over the TFT.

Another aspect is a method of manufacturing a display device, the method comprising: forming a substrate including an incompressible liquid layer;
forming a thin film transistor (TFT) over the substrate;
forming a first electrode over the TFT; and
forming a second electrode over the first electrode,
wherein the forming of the substrate includes:
forming a first layer formed of a polyimide,
etching the first layer,
injecting an incompressible liquid in the etched portion of the first layer, and
depositing a second layer formed of a polyimide over the first layer.

In the above method, the etching of the first layer comprises etching a portion of the first layer corresponding to the TFT.

In the above method, the injecting of the incompressible liquid is performed by an injection printing method.

DETAILED DESCRIPTION OF CERTAIN INVENTIVE EMBODIMENTS

Figure 1:
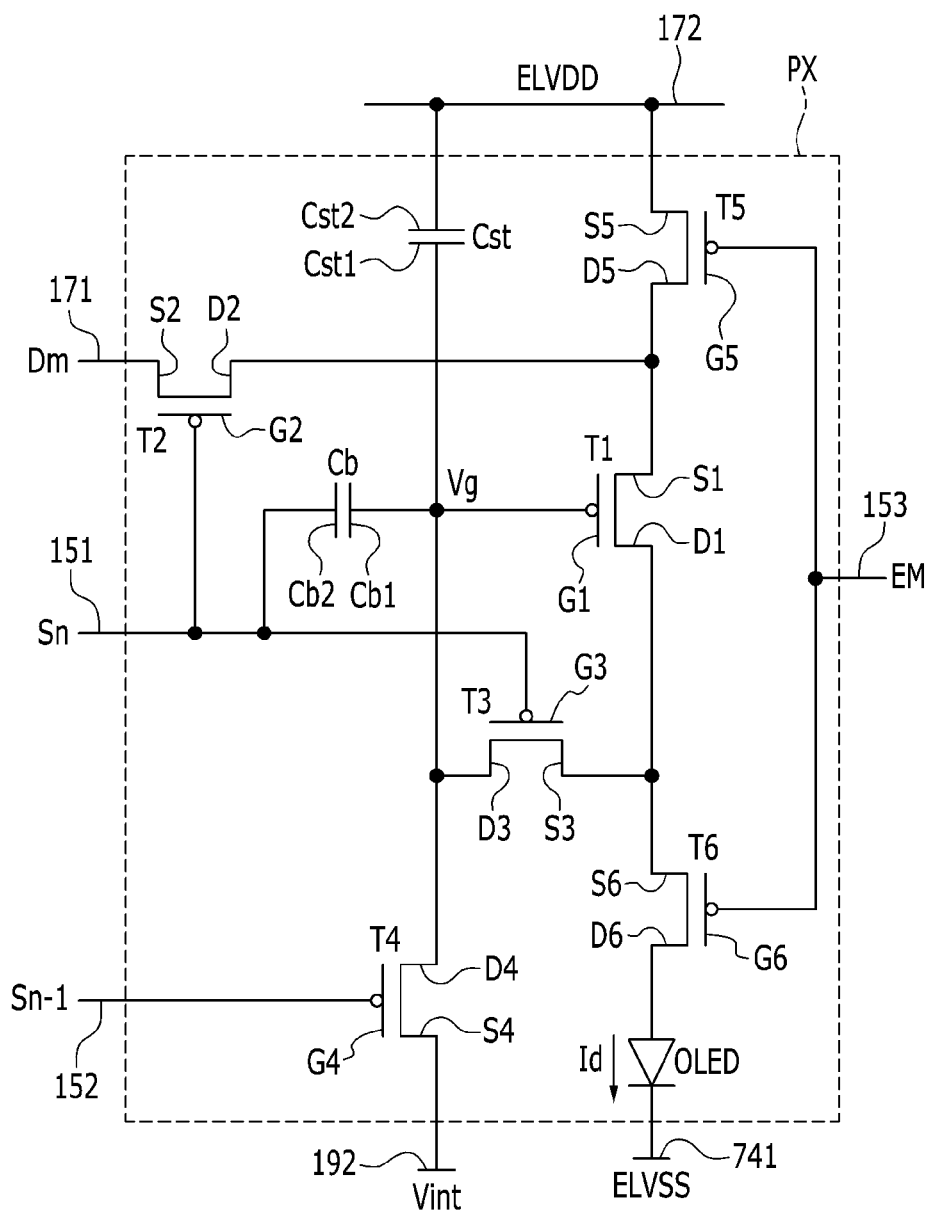
FIG. 1 is an equivalent circuit diagram illustrating an OLED display according to an exemplary embodiment.

The described technology will be described more fully hereinafter with reference to the accompanying drawings, in which exemplary embodiments are shown. As those skilled in the art would realize, the described embodiments can be modified in various different ways, all without departing from the spirit or scope of the described technology.

Parts which are not related with the description are omitted in order to clearly describe the described technology in the drawings. Like reference numerals designate like elements throughout the specification.

Further, in the drawings, size and thickness of each element are arbitrarily illustrated for convenience of description, and the described technology is not necessarily limited to those illustrated in the drawings. In the drawings, the thickness of layers, films, panels, regions, etc., are exaggerated for clarity. In the drawings, for better understanding and ease of description, the thickness of some layers and areas is exaggerated.

In addition, unless explicitly described to the contrary, the word "comprise" and variations such as "comprises" or "comprising" will be understood to imply the inclusion of stated elements but not the exclusion of any other elements. It will be understood that when an element such as a layer, film, region, or substrate is referred to as being "on" another element, it can be directly on the other element or intervening elements can also be present. Further, in the specification, the word "on" means positioning on or below the object portion, but does not necessarily mean positioning on the upper side of the object portion based on a gravity direction.

Further, in this specification, the word "on a plane" means viewing a target portion from the top, and the word "on a cross-section" means viewing a cross-section vertically cutting a target portion from the side.

The described technology can be applied to a display device which includes an OLED display or an LCD. First, an exemplary embodiment of the described technology applied to an OLED display will be described.

In the case of an exemplary embodiment of an OLED display, the described technology is not limited to the number of thin film transistors and capacitors illustrated in the accompanying drawings. The OLED display can have a plurality of transistors and one or more capacitors in one pixel, and can be formed to have various structures such that separate wiring is further formed or existing wiring is omitted. A pixel area is a minimum unit for displaying an image, and a pixel area includes a first electrode. The OLED display displays the image through the pixel areas.

Hereinafter, an OLED display according to an exemplary embodiment will be described in detail with reference to the accompanying drawings. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

FIG. 1 is an equivalent circuit diagram illustrating an OLED display according to an exemplary embodiment.

As illustrated in FIG. 1, the OLED display according to the exemplary embodiment includes a plurality of signal lines 151, 152, 153, 171, 172, and 192, and a plurality of pixels PX which are connected to the signal lines and arranged substantially in a matrix form.

One pixel PX includes a plurality of transistors T1, T2, T3, T4, T5, and T6 connected to the signal lines 151, 152, 153, 171, 172, and 192, capacitors Cst and Cb, and an OLED.

The signal lines 151, 152, 153, 171, 172, and 192 include a scan line 151, a previous scan line 152, a light emission control line 153, and an initialization voltage line 192 which apply a scan signal Sn, a previous scan signal Sn-1, a light emission control signal EM, and an initialization voltage Vint, respectively, and are formed in a row direction, and a data line 171 and a driving voltage line 172 which cross the scan line 151, the previous scan line 152, the light emission control line 153, and the initialization voltage line 192 and apply a data signal Dm and a driving voltage ELVDD, respectively.

The transistors T1, T2, T3, T4, T5, and T6 include a driving thin film transistor T1, a switching thin film transistor T2, a compensation transistor T3, an initialization transistor T4, an operation control transistor T5, and a light emission control transistor T6, and the capacitors Cst and Cb includes a storage capacitor Cst and a boosting capacitor Cb.

A gate electrode G1 of the driving thin film transistor T1 is connected with one end Cst1 of the storage capacitor Cst, a source electrode S1 of the driving thin film transistor T1 is connected with the driving voltage line 172 via the operation control thin film transistor T5, and a drain electrode D1 of the driving thin film transistor T1 is electrically connected with an anode of the OLED via the light emission control transistor T6. The driving thin film transistor T1 receives the data signal Dm according to a switching operation of the switching thin film transistor T2 to supply a driving current Id to the OLED.

A gate electrode G2 of the switching thin film transistor T2 is connected with the scan line 151, a source electrode S2 of the switching thin film transistor T2 is connected with the data line 171, and a drain electrode D2 of the switching thin film transistor T2 is connected with the source electrode S1 of the driving thin film transistor T1 and with the driving voltage line 172 via the operation control transistor T5. The switching thin film transistor T2 is turned on according to the scan signal Sn received through the scan line 151 to perform a switching operation that transfers the data signal Dm transferred to the data line 171 to the source electrode S1 of the driving thin film transistor T1.

A gate electrode G3 of the compensation transistor T3 is connected with the scan line 151, a source electrode S3 of the compensation transistor T3 is connected with the drain electrode D1 of the driving thin film transistor T1 and with an anode of the OLED via the light emission control transistor T6, and a drain electrode D3 of the compensation transistor T3 is connected with the drain electrode D4 of the initialization transistor T4, the gate electrode G1 of the driving thin film transistor T1, one end Cst1 of the storage capacitor Cst, and one end Cb1 of the boosting capacitor Cb. The compensation transistor T3 is turned on according to the scan signal Sn received through the scan line 151 to connect the gate electrode G1 and the drain electrode D1 of the driving thin film transistor T1 and diode-connect the driving thin film transistor T1.

A gate electrode G4 of the initialization transistor T4 is connected with the previous scan line 152, a source electrode S4 of the initialization transistor T4 is connected with the initialization voltage line 192, and a drain electrode D4 of the initialization transistor T4 is simultaneously connected with one end cb1 of the boosting capacitor Cb, one end Cst1 of the storage capacitor Cst, and the gate electrode G1 of the driving thin film transistor T1 via the drain electrode D3 of the compensation transistor T3. The initialization transistor T4 is turned on according to the previous scan signal Sn-1 received through the previous scan line 152 to transfer the initialization voltage Vint to the gate electrode G1 of the driving thin film transistor T1 and then perform an initialization operation that initializes a gate voltage Vg of the gate electrode G1 of the driving thin film transistor T1.

A gate electrode G5 of the operation control transistor T5 is connected with the light emission control line 153, a source electrode S5 of the operation control transistor T5 is connected with the driving voltage line 172, and a drain electrode D5 of the operation control transistor T5 is connected with the source electrode S1 of the driving thin film transistor T1 and the drain electrode S2 of the switching thin film transistor T2.

A gate electrode G6 of the light emission control transistor T6 is connected with the light emission control line 153, a source electrode S6 of the light emission control transistor T6 is connected with the drain electrode D1 of the driving thin film transistor T1 and the source electrode S3 of the compensation transistor T3, and a drain electrode D6 of the light emission control transistor T6 is electrically connected with an anode of the OLED. The operation control transistor T5 and the light emission control transistor T6 are simultaneously turned on according to the light emission control signal EM received through the light emission control line 153, and as a result, the driving voltage ELVDD is compensated through the diode-connected driving thin film transistor T1 to be transferred to the OLED and the driving current ld flows to the OLED to emit light, thereby displaying the image.

The scan line 151 connected with the gate electrode G2 of the switching thin film transistor T2 is connected with the other end Cb2 of the boosting capacitor Cb, and one end Cb1 of the boosting capacitor Cb is connected with the gate electrode G1 of the driving thin film transistor T1.

The other end Cst2 of the storage capacitor Cst is connected with the driving voltage line 172, and a cathode of the OLED is connected with a common voltage line 741 transferring a common voltage ELVSS.

Meanwhile, in the exemplary embodiment, the structure having six transistors and two capacitors is illustrated, but the described technology is not limited thereto, and the number of transistors and the number of capacitors can be variously modified.

Hereinafter, a detailed operation process of one pixel of the OLED display according to the exemplary embodiment will be described in detail.

First, for an initializing period, the previous scan signal Sn-1 having a low level is supplied through the previous scan line 152. Then, the initialization transistor T4 is turned on in response to the previous scan signal Sn-1 having the low level, the initialization voltage Vint is connected from the initialization voltage line 192 to the gate electrode G1 of the driving thin film transistor T1 through the initialization transistor T4, and the driving thin film transistor T1 is initialized by the initialization voltage Vint.

Thereafter, for a data programming period, the scan signal Sn having a low level is supplied through the scan line 151. Then, the switching thin film transistor T2 and the compensation transistor T3 are turned on in response to the scan signal Sn having the low level. In this case, the driving thin film transistor Ti is diode-connected by the turned-on compensation transistor T3 and biased in a forward direction.

Then, a compensation voltage Dm+Vth (Vth has a negative (−) value) having the value of the data signal Dm supplied from the data line 171 reduced by a threshold voltage Vth of the driving thin film transistor T1 is applied to the gate electrode G1 of the driving thin film transistor T1. That is, the gate voltage Vg applied to the gate electrode G1 of the driving thin film transistor T1 becomes the compensation voltage Dm+Vth. The driving voltage ELVDD and the compensation voltage Dm+Vth are applied to respective ends of the storage capacitor Cst, and a charge corresponding to a voltage difference between the respective ends is stored in the storage capacitor Cst.

Thereafter, when the voltage level of the scan signal Sn is changed to a high level while the supply of the scan signal Sn stops, the gate voltage Vg applied to the gate electrode G1 of the driving thin film transistor T1 is changed in response to a voltage change width of the scan signal Sn by coupling the boosting capacitor Cb. In this case, since the gate voltage Vg applied to the gate electrode G1 of the driving thin film transistor T1 is changed by charge sharing between the storage capacitor Cst and the boosting capacitor Cb, a voltage change amount applied to the gate electrode G1 is changed in proportion to a charge sharing value between the storage capacitor Cst and the boosting capacitor Cb in addition to the voltage change width of the scan signal Sn.

Thereafter, for the emission period, the light emission control signal EM supplied from the light emission control line 153 is changed from the high level to the low level. Then, for the emission period, the operation control transistor T5 and the light emission control transistor T6 are turned on by the light emission control signal EM at the low level.

Then, the driving current ld is generated according to a voltage difference between the gate voltage Vg of the gate electrode G1 of the driving thin film transistor T1 and the driving voltage ELVDD, and the driving current ld is supplied to the OLED through the light emission control transistor T6. For the emission period, the driving gate-source voltage Vgs of the driving thin film transistor T1 is maintained at '(Dm+Vth)-ELVDD' by the storage capacitor Cst, and according to a current-voltage relationship of the thin film transistor T1, the driving current ld is substantially proportional to the square '(Dm-ELVDD)$^2$' of a value obtained by subtracting the threshold voltage Vth from the driving source-gate voltage Vgs. Accordingly, the driving current ld is determined regardless of the threshold voltage Vth of the driving thin film transistor T1.

Next, a detailed structure of the pixel of the OLED display illustrated in FIG. 1 will be described in detail with reference to FIGS. 2, 3, 4, and 5 in addition to FIG. 1.

Figure 2:
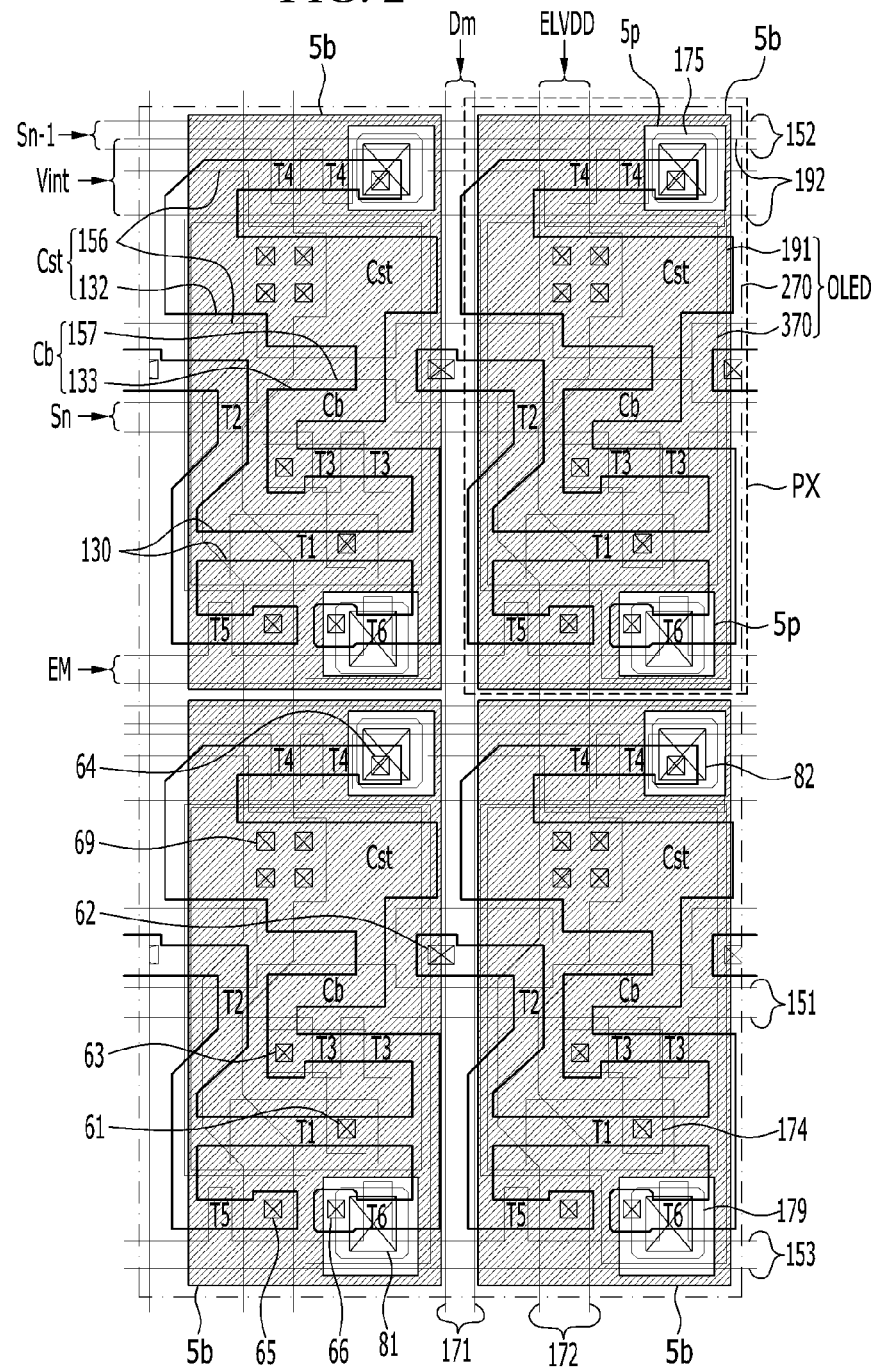
FIG. 2 is a diagram schematically illustrating a plurality of transistors and capacitors in the OLED display according to the exemplary embodiment.
Figure 3:
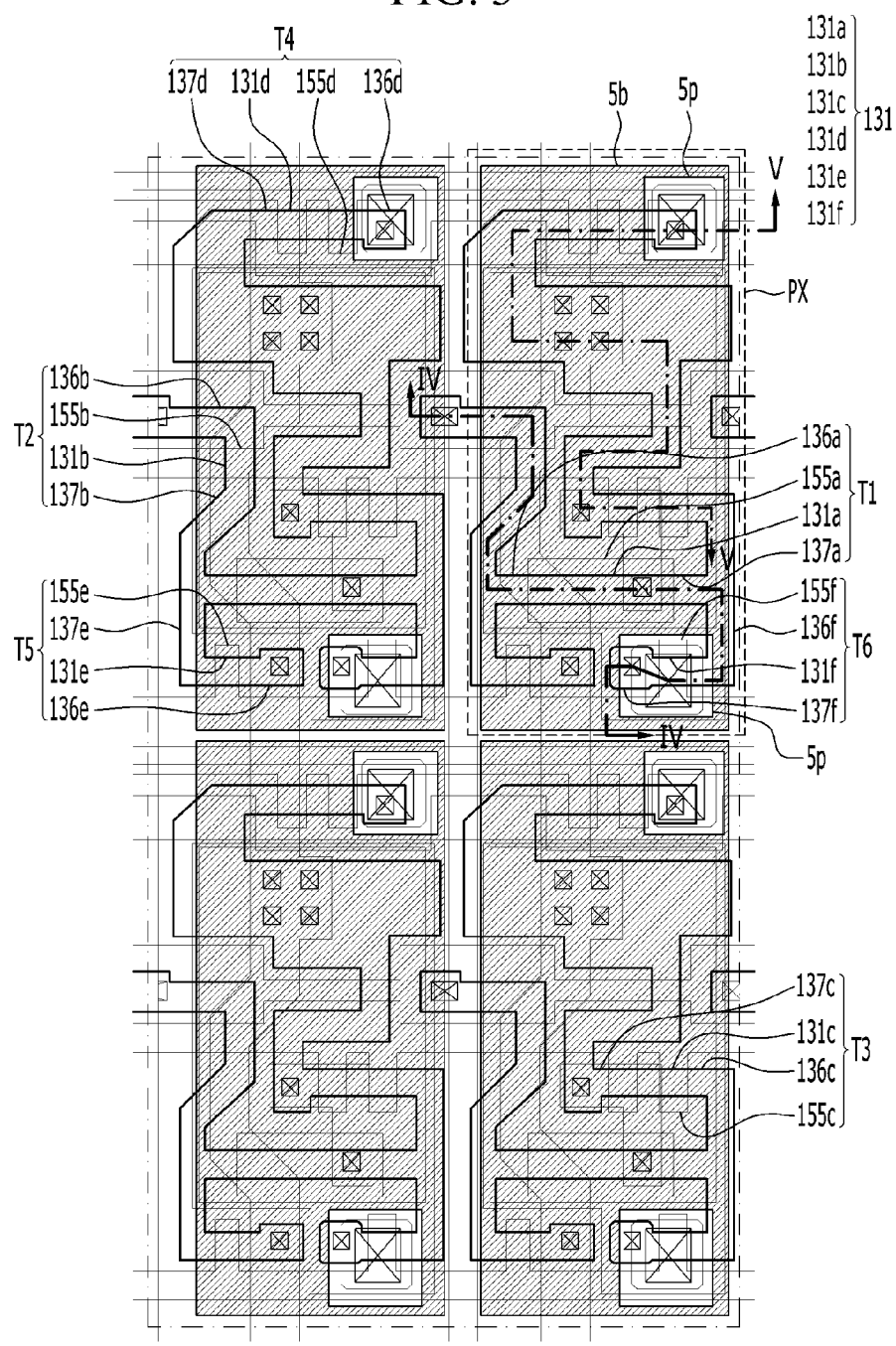
FIG. 3 is a detailed layout view of FIG. 2.
Figure 4:
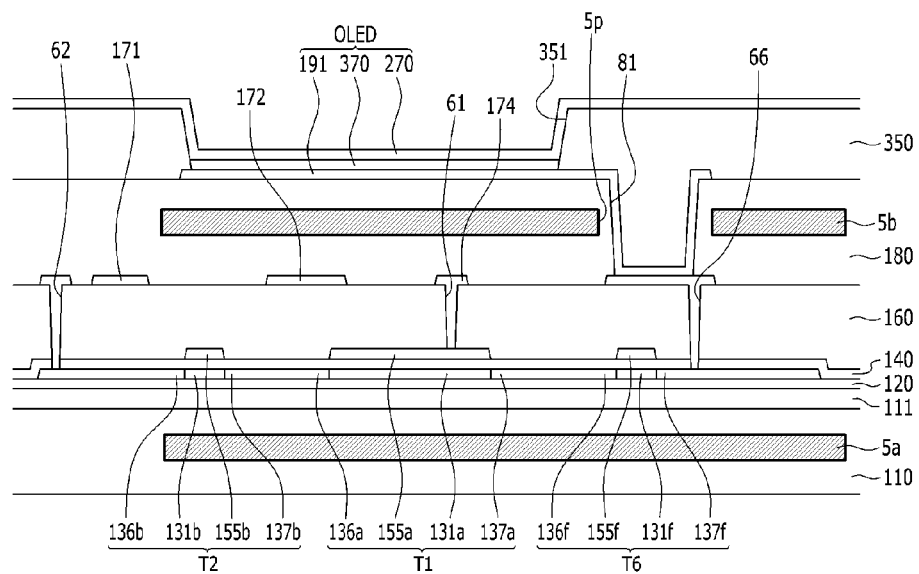
FIG. 4 is a cross-sectional view of the OLED display of FIG. 3 taken along line IV-IV.
Figure 5:
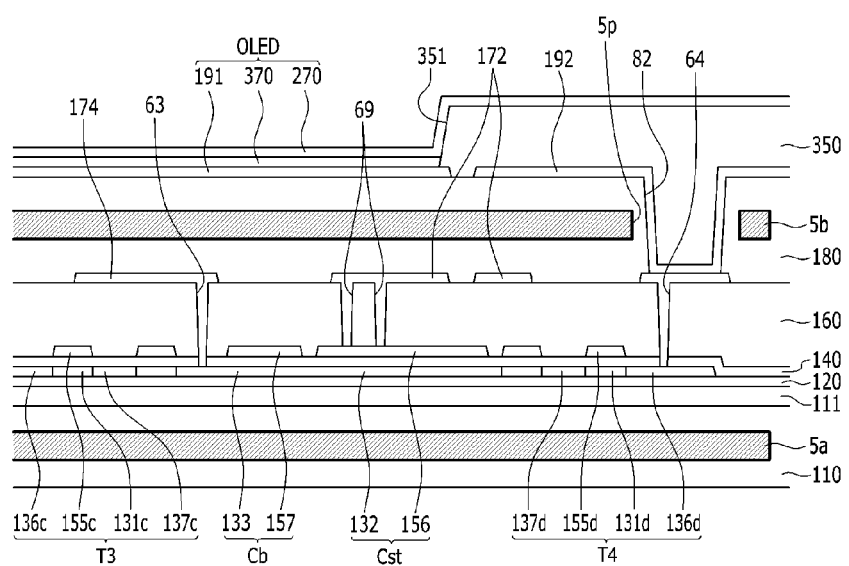
FIG. 5 is a cross-sectional view of the OLED display of FIG. 3 taken along line V-V.

FIG. 2 is a diagram schematically illustrating a plurality of transistors and capacitors formed in a plurality of pixels of the OLED display according to the exemplary embodiment. FIG. 3 is a detailed layout view of FIG. 2. FIG. 4 is a cross-sectional view of the OLED display of FIG. 3 taken along line IV-IV. FIG. 5 is a cross-sectional view of the OLED display of FIG. 3 taken along line V-V.

Hereinafter, a detailed planar structure of the OLED display according to the exemplary embodiment will be first described in detail with reference to FIGS. 2 and 3, and a detailed cross-sectional structure will be described in detail with reference to FIGS. 4 and 5.

As illustrated in FIG. 2, the OLED display according to the exemplary embodiment includes a plurality of scan lines 151, a plurality of previous scan lines 152, a plurality of light emission control lines 153, and a plurality of initialization voltage lines 192 which apply the scan signal Sn, the previous scan signal Sn-1, the light emission control signal EM, and the initialization voltage Vint, respectively, and are formed in a row direction, and a plurality of data lines 171 and a plurality of driving voltage lines 172 which cross the scan lines 151, the previous scan lines 152, the light emission control lines 153, and the initialization voltage lines 192 and apply the data signal Dm and the driving voltage ELVDD to a plurality of pixels PX, respectively. In FIG. 2, for convenience of description, four pixels PX which are connected to two scan lines 151, two previous scan lines 152, two light emission control lines 153, two initialization voltage lines 192, two data lines 171, and two driving voltage lines 172 are illustrated.

In one pixel PX, the driving thin film transistor T1, the switching thin film transistor T2, the compensation transistor T3, the initialization transistor T4, the operation control transistor T5, the light emission control transistor T6, the storage capacitor Cst, the boosting capacitor Cb, and the OLED are formed. The OLED includes a first electrode 191, an organic emission layer 370, and a second electrode 270. The first electrode 191 can be a pixel electrode, and the second electrode 270 can be a common electrode. In this case, the compensation transistor T3 and the initialization transistor T4 are configured by a dual gate structure transistor in order to block a leakage current.

Channels of the driving thin film transistor T1, the switching thin film transistor T2, the compensation transistor T3, the initialization transistor T4, the operation control transistor T5, and the light emission control transistor T6 are formed inside one semiconductor 130 and are connected, respectively, and the semiconductor 130 can be formed to be curved in various shapes. The semiconductor layer 130 can be formed of polysilicon or an oxide semiconductor. The oxide semiconductor can include any one of oxides based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O) which are complex oxides thereof. In the case where the semiconductor 130 is formed of the oxide semiconductor, in order to protect the oxide semiconductor that is vulnerable to an external environment such as a high temperature, a separate passivation layer can be added.

The semiconductor 130 includes a channel which is channel-doped with an N-type impurity or a P-type impurity, and a source doping region and a drain doping region which are formed at respective sides of the channel and doped at a higher concentration than the doping impurity doped on the channel. In the exemplary embodiment, the source doping region and the drain doping region correspond to the source electrode and the drain electrode, respectively. The source electrode and the drain electrodes formed in the semiconductor 130 can be formed by doping only the corresponding regions. Further, in the semiconductor 130, a region between source electrodes and drain electrodes of different transistors is doped and thus the source electrode and the drain electrode can be electrically connected to each other.

As illustrated in FIG. 2, the channel 131 formed in the semiconductor 130 includes a driving channel 131a formed in the drive transistor T1, a switching channel 131b formed in the switching thin film transistor T2, a compensation channel 131c formed in the compensation transistor T3, an initialization channel 131d formed in the initialization transistor T4, an operation control channel 131e formed in the operation control transistor T5, and a light emission control channel 131f formed in the light emission control transistor T6. In addition, in the semiconductor 130, a first storage electrode 132 and a first boosting electrode 133 are formed.

The driving thin film transistor T1 includes the driving channel 131a, a driving gate electrode 155a, a driving source electrode 136a, and a driving drain electrode 137e. The driving gate electrode 155a overlaps with the driving channel 131a, and the driving source electrode 136a and the driving drain electrode 137a are formed to be adjacent to respective sides of the driving channel 131a. The driving gate electrode 155a is connected with a driving connecting member 174 through a contact hole 61.

The switching thin film transistor T2 includes the switching channel 131b, a switching gate electrode 155b, a switching source electrode 136b, and a switching drain electrode 137b. The switching gate electrode 155b which is a part of the scan line 151 overlaps with the switching channel 131b, and the switching source electrode 136b and the switching drain electrode 137b are formed to be adjacent to respective sides of the switching channel 131b. The switching source electrode 136b is connected with the data line 171 through a contact hole 62.

The compensation transistor T3 includes the compensation channel 131c, a compensation gate electrode 155c, a compensation source electrode 136c, and a compensation drain electrode 137c. Two compensation gate electrodes 155c are formed so as to prevent a leakage current, and the two compensation gate electrodes 155c can be projections extended downward from the scan line 151. The compensation gate electrode 155c overlaps with the compensation channel 131c, and the compensation source electrode 136c and the compensation drain electrode 137c are formed to be adjacent to respective sides of the compensation channel 131c. The compensation drain electrode 137c is connected with the driving connecting member 174 through a contact hole 63.

The initialization transistor T4 includes the initialization channel 131d, an initialization gate electrode 155d, an initialization source electrode 136d, and an initialization drain electrode 137d. Two initialization gate electrodes 155d are formed so as to prevent a leakage current, and the two initialization gate electrodes 155d can be projections extended downward from the previous scan line 152. The initialization gate electrodes 155d overlaps with the initialization channel 131d, and the initialization source electrode 136d and the initialization drain electrode 137d are formed to be adjacent to respective sides of the initialization channel 131d. The initialization source electrode 136d is connected with an initialization connecting member 175 through a contact hole 64, and the initialization drain electrode 137d is connected with the driving connecting member 174 through the contact hole 63.

The operation control transistor T5 includes the operation control channel 131e, an operation control gate electrode 155e, an operation control source electrode 136e, and an operation control drain electrode 137e. The operation control gate electrode 155e which is a projection extended upward from the light emission control line 153 overlaps with the operation control channel 131e, and the operation control source electrode 136e and the operation control drain electrode 137e are formed to be adjacent to respective sides of the operation control channel 131e. The operation control source electrode 136e is connected with a part of the driving voltage line 172 through a contact hole 65.

The light emission control transistor T6 includes the light emission control channel 131f, a light emission control gate electrode 155f, a light emission control source electrode 136f, and a light emission control drain electrode 137f. The light emission control gate electrode 155f which is a projection extended upward from the light emission control line 153 overlaps with the light emission control channel 131f, and the light emission control source electrode 136f and the light emission control drain electrode 137f are formed to be adjacent to respective sides of the light emission control channel 131f. The light emission control drain electrode 137f is connected with a light emission control connecting member 179 through a contact hole 66.

The driving source electrode 136a is connected with the switching drain electrode 137b and the operation control drain electrode 137e, and the driving drain electrode 137a is connected with the compensation source electrode 136c and the light emission control source electrode 136f.

The storage capacitor Cst includes the first storage electrode 132 and a second storage electrode 156 which are interposed with a gate insulating layer 140 therebetween. Herein, the gate insulating layer 140 is a dielectric material, and a storage capacitance is determined by charges stored in the storage capacitor Cst and a voltage between the two electrodes 132 and 156.

The first storage electrode 132 is formed on the same layer as the channel 131, and the second storage electrode 156 is formed on the same layer as the scan line 151, the previous scan line 152, and the light emission control line 153. The first storage electrode 132 includes a doping impurity.

The first storage electrode 132 is formed between the compensation drain electrode 177c and the initialization drain electrode 177d, and is connected with the driving gate electrode 155a through the first boosting electrode 133 and the driving connecting member 174. The second storage electrode 156 is connected with the driving voltage line 172 through a contact hole 69.

Accordingly, the storage capacitor Cst stores a storage capacitance corresponding to a difference between the driving voltage ELVDD transferred to the second storage electrode 156 through the driving voltage line 172 and the gate voltage Vg of the driving gate electrode 155a.

The first boosting electrode 133 of the boosting capacitor Cb is an extension extended from the first storage electrode 132, and a second boosting electrode 157 is a projection extended upward from the scan line 151. The boosting capacitor Cb performs a boosting operation that increases the gate voltage Vg of the driving gate electrode 155a according to a change of the scan signal Sn of the scan line 151 to improve a driving range, thereby implementing more accurate grays.

The driving connecting member 174 is formed on the same layer as the data line 171, and one end of the driving connecting member 174 is connected with the driving gate electrode 155a through the contact hole 61. In addition, the other end of the driving connecting member 174 is connected with the compensation drain electrode 137c of the compensation transistor T3 through the contact hole 63. Accordingly, the driving connecting member 174 connects the driving gate electrode 155a and the compensation drain electrode 137c of the compensation transistor T3 to each other.

The initialization connecting member 175 having a quadrangular shape is connected with the initialization voltage line 192 through a contact hole 82, and the light emission control connecting member 179 having a quadrangular shape is connected with the pixel (first) electrode 191 of the OLED through a contact hole 81. In the exemplary embodiment illustrated in FIGS. 2 and 3, the initialization voltage line has a linear shape which is parallel with the scan line, and the pixel electrode has a substantially quadrangular shape almost covering the pixel. However, the described technology is not particularly limited to the shapes of the pixel electrode and the initialization voltage line, and the shapes can be variously modified as long as the shapes are connected with the initialization connecting member and the light emission control connecting member.

Hereinafter, the structure of the OLED display according to the exemplary embodiment will be described in detail according to a laminating order with reference to FIGS. 4 and 5.

In this case, since a laminating structure of the operation control transistor T5 is mostly the same as that of the light emission control transistor T6, a detailed description of the operation control transistor T5 will be omitted.

The substrate 110 is a flexible substrate and can be made of a material having flexibility and insulating properties, and can be formed of an organic material selected from a group consisting of thin glass, polyethersulfone (PES), polyacrylate, (PAR), polyetherimide (PEI), polyethylene naphthalate (PEN), polyethylene terephthalate (PET), polyphenylene sulfide (PPS), polyarylate (PA), polyimide (PI), polycarbonate (PC), triacetate cellulose (TAC), and cellulose acetate propionate (CAP).

First incompressible liquid layers 5a are disposed at positions in the substrate 110 corresponding to each of the pixel areas PX, respectively. In the present exemplary embodiment, the first incompressible liquid layer 5a has a shape such as rectangular overlapping almost the entire pixel area PX, but the first incompressible liquid layer 5a is not limited to the rectangular shape, and can have a shape such as circular or polygonal. Also, since the first incompressible liquid layer 5a is used for reducing strain of a configuration of the display device such as the thin film transistor, as necessary, the first incompressible liquid layer 5a can be optionally disposed where the strain needs to be reduced. The first incompressible liquid layer 5a can have a stripe pattern, a matrix pattern, etc., but the patterns are not limited thereto.

Since most liquids are incompressible, the first incompressible liquid layer 5a is not limited to a certain material. Any liquid which is incompressible, including $H_2O$ and so on, can be used as a raw material of the first incompressible liquid layer 5a.

A barrier film 111 is formed on the substrate 110, and a buffer layer 120 is formed on the barrier film.

The barrier film 111 is formed so as to improve a characteristic of polysilicon by preventing impurities from permeating from the substrate during a crystallization process for forming polysilicon configuring the semiconductor 130, and can be formed of a silicon nitride (SiNx), a silicon oxide (SiOx), or the like. The buffer layer 120 serves to planarize the barrier film 111 to alleviate the stress applied to the semiconductor 130 formed on the buffer layer 120, and is formed of a silicon nitride (SiNx), a silicon oxide (SiOx), or the like. The barrier film 111 and the buffer layer 120 can both be formed or only one thereof can be formed.

On the buffer layer 120, the semiconductor 130 is formed, which includes the driving channel 131a, the switching channel 131b, the compensation channel 131c, the initialization channel 131d, the operation control channel 131e, the light emission control channel 131f, the first storage electrode 132, and the first boosting electrode 133. The driving source electrode 136a and the driving drain electrode 137a are formed on respective sides of the driving channel 131a in the semiconductor 130, and the switching source electrode 136b and the switching drain electrode 137b are formed on respective sides of the switching channel 131b. In addition, the compensation source electrode 136c and the compensation drain electrode 137c are formed at respective sides of the compensation channel 131c, and the initialization source electrode 136d and the initialization drain electrode 137d are formed at respective sides of the initialization channel 131d. Further, the operation control source electrode 136e and the operation control drain electrode 137e are formed at respective sides of the operation control channel 131e, and the light emission control source electrode 136f and the light emission control drain electrode 137f are formed at respective sides of the light emission control channel 131f. In addition, the first storage electrode 132 and the first boosting electrode 133 are formed between the compensation drain electrode 137c and the initialization drain electrode 137d.

The gate insulating layer 140 is formed on the semiconductor 130. The gate insulating layer 140 can be formed of a silicon nitride ($SiN_x$) or a silicon oxide (SiOx).

On the gate insulating layer 140, gate wires 151, 152, 153, 155a, 156, and 157 are formed, which include the scan line 151 including the switching gate electrode 155b and the compensation gate electrode 155c, the previous scan line 152 including the initialization gate electrode 155d, the light emission control line 153 including the operation control gate electrode 155e and the light emission control gate electrode 155f, the driving gate electrode 155e, the second storage electrode 156, and the second boosting electrode 157.

The gate wires 151, 152, 153, 155a, 156, and 157 can be formed as multilayers in which metal layers including any one of copper (Cu), a copper alloy, aluminum (Al), an aluminum alloy, molybdenum (Mo), and a molybdenum alloy.

On the gate insulating layer 140 and the gate wires 151, 152, 153, 155a, 156, and 157, an interlayer insulating layer 160 covering the gate insulating layer 140 and the gate wires 151, 152, 153, 155a, 156, and 157 is formed. The interlayer insulating layer 160 can be made of silicon nitride ($SiN_x$), silicon oxide ($SiO_2$), or the like.

Data wires 171, 172, 174, 175, and 179 which include the data line 171, the driving voltage line 172, the driving connecting member 174, the initialization connecting member 175, and the light emission control connecting member 179 are formed on the second insulating layer 160. The data wires 171, 172, 174, 175, and 179 can be formed as multilayers in which metal layers including any one of copper (Cu), a copper alloy, aluminum (Al), an aluminum alloy, molybdenum (Mo), and a molybdenum alloy, and for example, can be formed as triple layers of titanium/aluminum/titanium (Ti/Al/Ti), molybdenum/aluminum/molybdenum (Mo/Al/Mo), or molybdenum/copper/molybdenum (Mo/Cu/Mo).

The data line 171 is connected with the switching source electrode 136b through the contact hole 62 formed to have the same boundary line in the gate insulating layer 140 and the interlayer insulating layer 160, one end of the driving connecting member 174 is connected with the driving gate electrode 155a through the contact hole 61 formed in the interlayer insulating layer 160, and the other end of the driving connecting member 174 is connected with the compensation drain electrode 137c through the contact hole 63 formed to have the same boundary line in the gate insulating layer 140 and the interlayer insulating layer 160.

The initialization connecting member 175 is connected with the initialization source electrode 136d through the contact hole 64 formed in the gate insulating layer 140 and the interlayer insulating layer 160. In addition, the light emission control connecting member 179 is connected with the light emission control drain electrode 137f through a contact hole 66 formed on the gate insulating layer 140 and the interlayer insulating layer 160.

A passivation layer 180 covering the data wires 171, 172, 174, and 179 and the interlayer insulating layer 160 is formed on the data wires 171, 172, 174, and 179 and the interlayer insulating layer 160. Since the passivation layer 180 covers and planarizes the data wires 171, 172, 174, and 179, the pixel electrode 191 can be formed on the passivation layer 180 without a step. The passivation layer 180 can be made of an organic material such as a polyacrylate resin and a polyimide resin, or a laminated layer of the organic material and the inorganic material.

Second incompressible liquid layers 5b are disposed in the passivation layer 180, corresponding to each of the pixel areas PX, respectively. In the present exemplary embodiment, the second incompressible liquid layers 5b have a shape such as rectangular overlapping almost the entire pixel area PX and corresponding to each of the first incompressible liquid layers 5a. The second incompressible liquid layer 5b has two rectangular opening patterns 5p corresponding to the contact holes 81 and 82 which are formed on the passivation layer 180.

However, the second incompressible liquid layer 5b is not limited to the rectangular shape, and can have a shape such as circular or polygonal. Further, the rectangular opening patterns 5p is not limited to the rectangular shape, and can also have a shape such as circular or polygonal. In addition, since the second incompressible liquid layer 5b is used for reducing strain of a configuration of the display device such as the thin film transistor, as necessary, the second incompressible liquid layer 5b can be optionally disposed at positions where the strain needs to reduce, like the first incompressible liquid layer 5a. The second incompressible liquid layer 5b can be formed as a stripe pattern, a matrix pattern, and so on, as the patterns are not limited to a certain pattern.

Also, in some embodiments, the shapes or the locations of the first incompressible liquid layer 5a and the second incompressible liquid layer 5b do not completely overlap each other.

Since most liquids are incompressible, the second incompressible liquid layer 5b is not limited to a certain material. Any liquid which is incompressible, such as $H_2O$ and so on, can be used as a raw material of the second incompressible liquid layer 5b.

In the present exemplary embodiment, the second incompressible liquid layer 5b is disposed in the passivation layer 180, but according to exemplary embodiments, the second incompressible liquid layer 5b can be disposed in the interlayer insulating layer 160 or in both of the passivation layer 180 and the interlayer insulating layer 160. Also, one of the first incompressible liquid layer 5a and the second incompressible liquid layer 5b can be omitted.

A pixel electrode 191 and an initialization voltage line 192 are formed on the passivation layer 180. The light emission control connecting member 179 is connected with the pixel electrode 191 through the contact hole 81 formed in the passivation layer 180, and the initialization connecting member 175 is connected with the initialization voltage line 192 through the contact hole 82 formed in the passivation layer 180.

A pixel defined layer (PDL) 350 covering the passivation layer 180, the initialization voltage line 192, and the pixel electrode 191 is formed on edges of the passivation layer 180, the initialization voltage line 192, and the pixel electrode 191, and the PDL 350 has a pixel opening 351 that exposes the pixel electrode 191. The PDL 350 can be made of an organic material such as a polyacrylate resin and a polyimide resin, or a silica-based inorganic material.

The organic emission layer 370 is formed on the pixel electrode 191 exposed by the pixel opening 351, and the common (second) electrode 270 is formed on the organic emission layer 370. The common electrode 270 is formed on the PDL 350 to be formed over the pixel areas. As such, the OLED, which includes the pixel electrode 191, the organic emission layer 370, and the common electrode 270 is formed.

Here, the pixel electrode 191 is an anode which is a hole injection electrode, and the common electrode 270 is a cathode which is an electron injection electrode. However, the exemplary embodiment is not limited thereto, and according to a driving method of the OLED display, the pixel electrode 191 can be the cathode, and the common electrode 270 can be the anode. Holes and electrons are injected into the organic emission layer 370 from the pixel electrode 191 and the common electrode 270, respectively, and excitons generated by coupling the injected holes and electrons fall from an excited state to a ground state to emit light.

The organic emission layer 370 can be formed of a low-molecular organic material or a high-molecular organic material such as poly(3,4-ethylenedioxythiophene) (PEDOT). Further, the organic emission layer 370 can be formed as a multilayer including a light emission layer, and one or more of a hole injection layer (HIL), a hole transporting layer (HTL), an electron transporting layer (ETL), and an electron injection layer (EIL). In the case where the organic emission layer includes all the layers, the HIL is disposed on the pixel electrode 191 which is the anode, and the HTL, the light emitting layer, the ETL, and the EIL are sequentially laminated thereon.

The organic emission layer 370 can include a red organic emission layer emitting red light, a green organic emission layer emitting green light, and a blue organic emission layer emitting blue light. The red organic emission layer, the green organic emission layer, and the blue organic emission layer are formed in a red pixel, a green pixel, and a blue pixel, respectively, thereby implementing a color image.

Further, in the organic emission layer 370, all of the red organic emission layer, the green organic emission layer, and the blue organic emission layer are laminated together on the red pixel, the green pixel, and the blue pixel, and a red color filter, a green color filter, and a blue color filter are formed for each pixel, thereby implementing the color image. As another example, white light emitting layers emitting white light are formed on all of the red pixel, the green pixel, and the blue pixel, and a red color filter, a green color filter, and a blue color filter are formed for each pixel, thereby implementing the color image. In the case of implementing the color image by using the white organic emission layer and the color filters, it is not required to use a deposition mask for depositing the red organic emission layer, the green organic emission layer, and the blue organic emission layer on respective pixels, that is, the red pixel, the green pixel, and the blue pixel.

As another example, the white organic emission layer can be formed by one organic emission layer, and also includes a configuration formed so as to emit white light by laminating a plurality of organic emission layers. For example, the white organic emission layer includes a configuration which can emit white light by combining at least one yellow organic emission layer and at least one blue light emitting layer, a configuration which can emit white light by combining at least one cyan organic emission layer and at least one red light emitting layer, a configuration which can emit white light by combining at least one magenta organic emission layer and at least one green light emitting layer, and the like.

An encapsulation member (not illustrated) protecting the OLED can be formed on the common electrode 270, and the encapsulation member can be sealed on the substrate 110 by a sealant and formed of various materials including glass, crystal, ceramic, plastic, and metal. Meanwhile, a thin film encapsulation layer can be formed by depositing an inorganic layer and an organic layer on the common electrode 270 without using the sealant.

While the described technology has been described in connection with what is applied to an OLED display, the described technology can be applied to an LCD, and the first incompressible liquid layer 5a can be disposed in a lower substrate and the second incompressible liquid layer 5b can be disposed in an upper substrate. Also, one of the first incompressible liquid layer 5a and the second incompressible liquid layer 5b can be omitted. When the upper substrate of LCD is omitted, the second incompressible liquid layer 5b can be omitted.

An exemplary embodiment in which the exemplary embodiment of the present disclosure is applied to a curved LCD and effects that such exemplary embodiment provides will now be described with reference to FIGS. 6 to 9.

Figure 6:
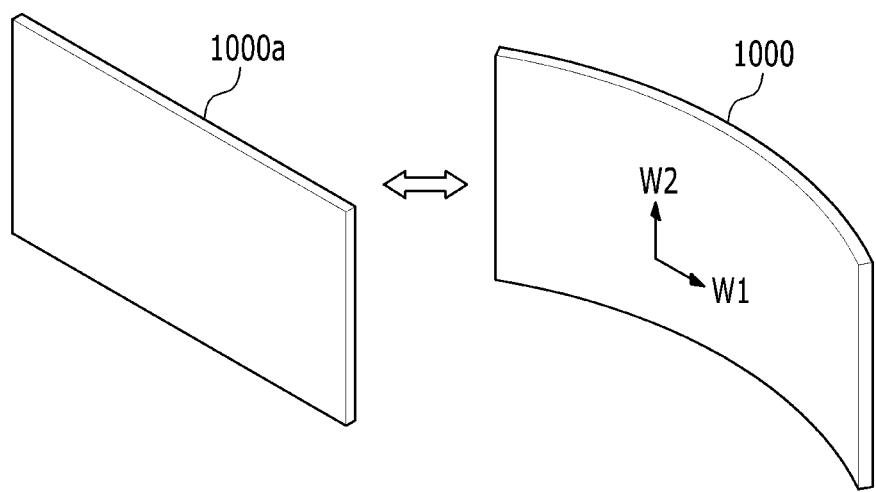
FIG. 6 illustrates a perspective view of a curved display device according to an exemplary embodiment of the present disclosure.
Figure 7:
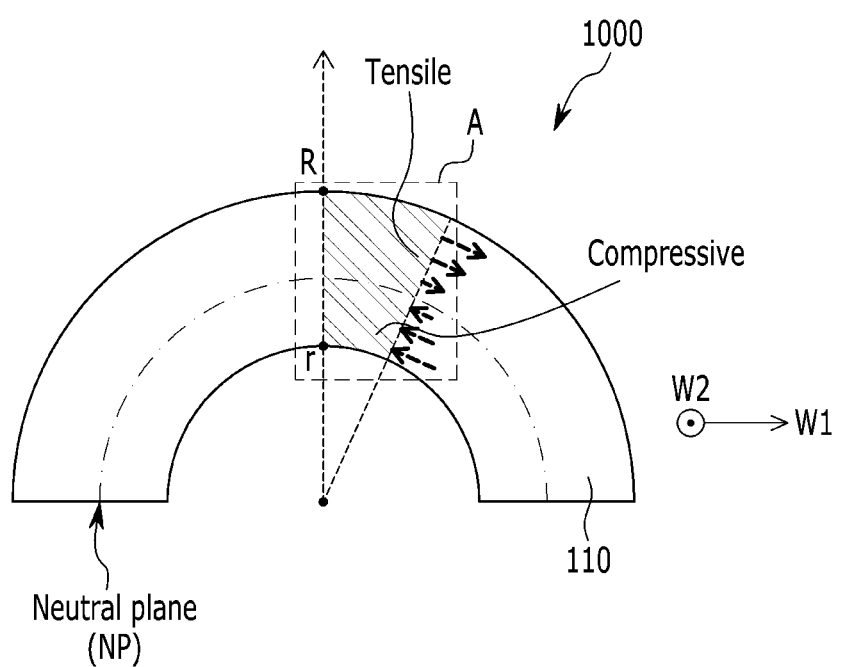
FIG. 7 illustrates the curved display device viewed from the side of FIG. 6.
Figure 8:
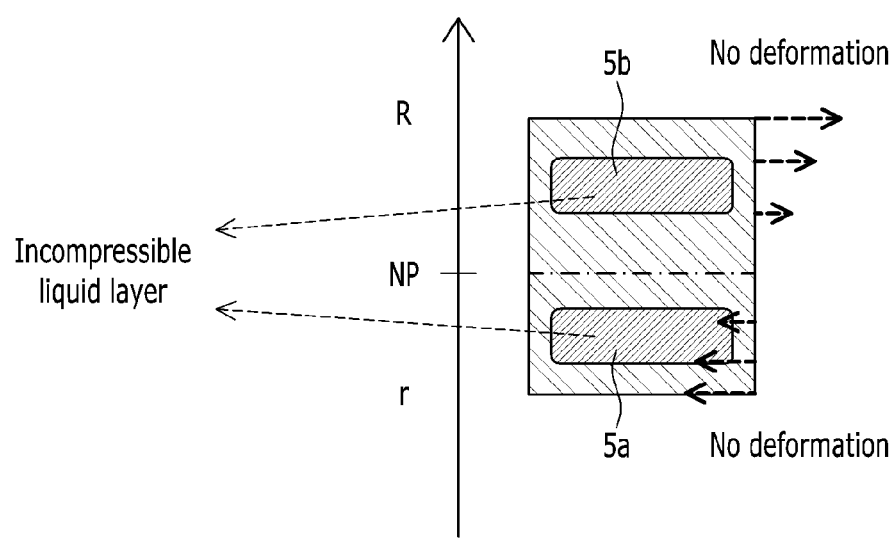
FIG. 8 is a detailed drawing of the portion A of FIG. 7.
Figure 9:
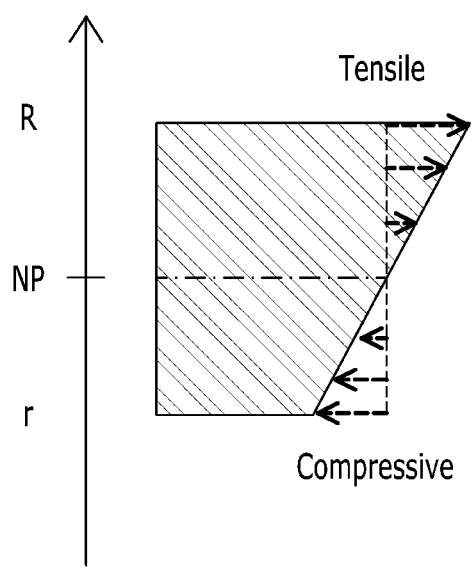
FIG. 9 is a drawing of a comparative example which does not include an incompressible liquid layer.

FIG. 6 illustrates a perspective view of a curved display device according to an exemplary embodiment of the present disclosure. FIG. 7 illustrates the curved display device viewed from the side of FIG. 6. FIG. 8 is a detailed drawing of the portion A of FIG. 7. FIG. 9 is a drawing of a comparative example which does not include an incompressible liquid layer.

As shown in FIG. 6, a curved display device 1000 according to an exemplary embodiment of the present disclosure is formed to be bent with a predetermined curvature. A second direction W2 is a direction that data lines are extended, and a first direction W1 and the second direction W2 are substantially perpendicular to or crossing each other. The curved display device can be bent along a direction parallel to at least one of the first direction W1 and the second direction W2. That is, although the curved display device 1000 is bent along the first direction W1 in FIG. 6, it can be bent in the second direction W2 or in both the first direction W1 and the second direction W2. The curved display device 1000 according to the exemplary embodiment of the present disclosure is formed by manufacturing a flat LCD (1000a) and then bending the same. The curved display device 1000 can be flexible, but is not limited thereto, and therefore can be stretchable, foldable, bendable, or rollable.

Regarding the flat LCD, the distance from the viewer's eye to a plurality of pixels included in the flat liquid display device varies. For example, the distance from the viewer's eye to pixels on the left and right edges of the flat display device is longer than the distance from the viewer's eye to pixels at the center of the flat-panel display device. On the contrary, in the curved LCD 1000 according to the exemplary embodiment of the present disclosure, the distance from the viewer's eye to a plurality of pixels is nearly constant, provided that the viewer's eye is at the center of a circle formed by extending the curve. Since such a curved LCD provides a wider viewing angle than the flat-panel display device, photoreceptor cells are stimulated by more information, sending more visual information to the brain through optic nerves. Accordingly, the sense of reality and immersion can be heightened.

As shown in FIG. 7, when the curved display device 1000 is bent, tensile stress occurs at its convex outer side and compressive stress occurs at its concave inner side, and a neutral plane NP at which no stress occurs is present in an intermediate region therebetween.

A picture abnormality does not occur in the display device only when the thin film transistors are positioned at the neutral plane. However, when the thickness of the display device is increased by internal and external films such as a polarizing film and a passivation film attached to the display device, the tensile stress and the compressive stress are increased such that the neutral plane becomes narrow, thereby making it difficult to position the thin film transistors on the neutral plane. Further, the display device has a structure in which composite materials are layered and thus asymmetry of strains occurs due to a difference between tensile stress and compressive stress that are applied to outer and inner sides of a bent portion. Accordingly, it is difficult to position the thin film transistors on the neutral plane, thereby causing display defects.

Even if the curved display device is modified according to bending, maintaining stable performance of thin film transistors is important. This is because the stable performance of thin film transistors exercises great influence on quality of the display device.

In addition, when the display device is bent, a moisture permeation path can be created in a display area by cracks due to excessive stress, and in the case of the OLED display, deformation of organic and inorganic layers forming a thin film encapsulation layer can cause deformation of the display area or other defects.

However, as in FIG. 8 showing a detailed drawing of the portion A of FIG. 7, when the curved display device 1000 includes the incompressible liquid layers 5a and 5b, the deformation according to bending would be decreased due to resistance of the incompressible liquid layers 5a and 5b toward deformation. The incompressible liquid layers 5a and 5b have a noncompression property even when in a tensile or compressive state, and this noncompression property reduces the deformation of the horizontal length of portion where the incompressible liquid layers 5a and 5b exist. Therefore, even if the curved display device is modified according to bending, thin film transistors can maintain stable performance.

For example, the first incompressible liquid layer 5a is disposed on the lower side of the neutral plane NP, and the second incompressible liquid layer 5b is disposed on the upper side of the neutral plane NP. However, locations of the incompressible liquid layers 5a and 5b are not limited to the above-stated locations, and even if one of the first incompressible liquid layer 5a and the second incompressible liquid layer 5b is omitted, it has the effect. If the incompressible liquid layers 5a and 5b have a greater area, the effect is increased.

However, with reference to FIG. 9, in the case of the comparative example which does not include an incompressible liquid layer, deformation of the horizontal length occurs in the direction of the arrow when the curved display device 1000 is bent. That is, the lower side of the neutral plane NP is shrunken by compressive stress, the upper side of the neutral plane NP is extensible by tensile strength. In this case, the curved display device 1000 is deformed or damaged.

Figure 11:
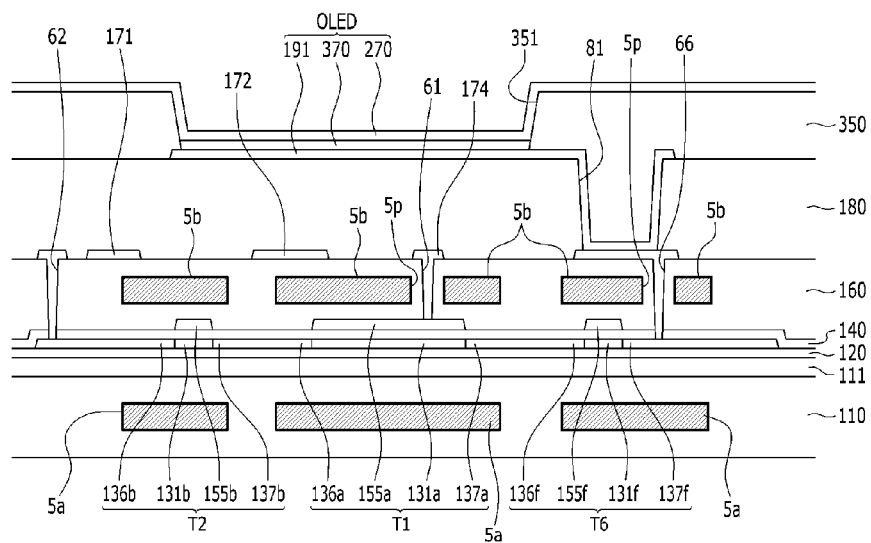
FIG. 11 is a cross-sectional view of the OLED display of FIG. 10 taken along line VI-XI.
Figure 12:
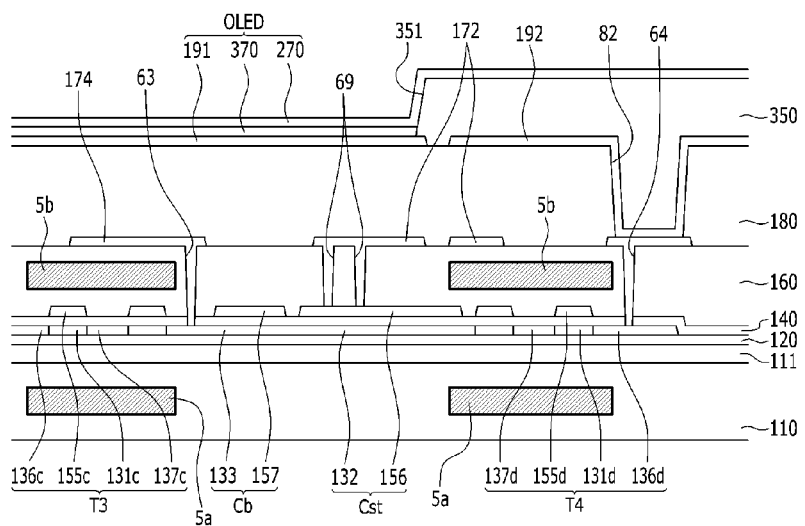
FIG. 12 is a cross-sectional view of the OLED display of FIG. 10 taken along line XII-XII.

Hereinafter, the OLED display according to the exemplary embodiment will be described with reference to FIGS. 10 to 12. The detailed descriptions of the same constituent elements of the LCD according to the exemplary embodiment described with reference to FIGS. 1 to 5 are omitted.

Figure 10:
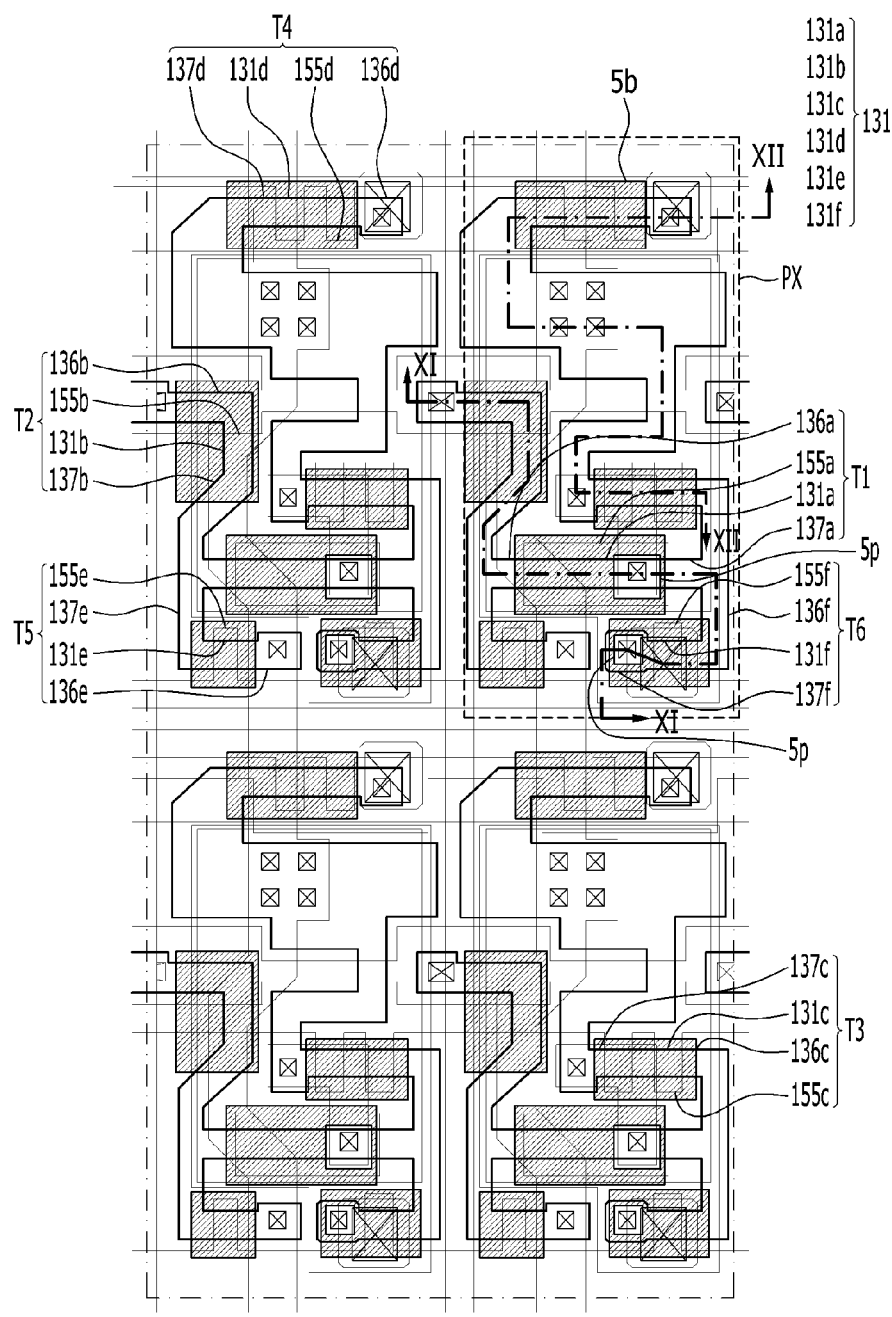
FIG. 10 is a layout view of a plurality of transistors and a plurality of capacitors which are formed in a plurality of pixel areas of an OLED display according to an exemplary embodiment of the present disclosure.

FIG. 10 is a layout view of a plurality of transistors and a plurality of capacitors which are formed in a plurality of pixel areas of an OLED display according to an exemplary embodiment of the present disclosure. FIG. 11 is a cross-sectional view of the OLED display of FIG. 10 taken along line XI-XI. FIG. 12 is a cross-sectional view of the OLED display of FIG. 10 taken along line XII-XII.

The first incompressible liquid layers 5a are disposed at positions in the substrate 110 corresponding to each of the transistors T1, T2, T3, T4, T5, and T6. In the present exemplary embodiment, the first incompressible liquid layers 5a have a shape such as rectangular, and are optionally disposed corresponding to each of the transistors T1, T2, T3, T4, T5, and T6. However, the first incompressible liquid layer 5a is not limited to the rectangular shape, and can also have a shape such as circular or polygonal.

Furthermore, in the present exemplary embodiment, the first incompressible liquid layers 5a are separated from each other, but according to exemplary embodiments, the first incompressible liquid layers 5a can be connected each other.

Also, since the first incompressible liquid layer 5a can be optionally disposed at positions where the strain needs to be reduced the first incompressible liquid layers 5a are not disposed corresponding to all of the transistors T1, T2, T3, T4, T5, and T6, but can be disposed corresponding to some of the transistors T1, T2, T3, T4, T5, and T6.

For example, the first incompressible liquid layers 5a is optionally disposed at positions corresponding to the transistors T1, T5, and T6. Furthermore, the first incompressible liquid layer 5a can be optionally disposed at the position corresponding to the transistor T1.

The second incompressible liquid layers 5b are disposed at positions in the interlayer insulating layer 160 corresponding to each of the transistors T1, T2, T3, T4, T5, and T6. In the present exemplary embodiment, the second incompressible liquid layers 5b have a shape such as rectangular, and are optionally disposed corresponding to each of the transistors T1, T2, T3, T4, T5, and T6. The second incompressible liquid layers 5b have two rectangular opening patterns 5p corresponding to the contact holes 61 and 66 which are formed on the interlayer insulating layer 160. However the second incompressible liquid layer 5b is not limited to the rectangular shape, and can also have a shape such as circular or polygonal. Further, the rectangular opening patterns 5p is not limited to the rectangular shape, and can also have a shape such as circular or polygonal.

Furthermore, in the present exemplary embodiment, the second incompressible liquid layers 5b are separated from each other, but according to exemplary embodiments, the second incompressible liquid layers 5b can be connected each other. In this case, the connected second incompressible liquid layers 5b do not overlap the contact holes 61, 62, 63, 64, 65, 66, and 69.

Also, since the second incompressible liquid layer 5b can be optionally disposed at positions where the strain needs to be reduced, the second incompressible liquid layers 5b are not disposed corresponding to all of the transistors T1, T2, T3, T4, T5, and T6, but can disposed corresponding to some of the transistors T1, T2, T3, T4, T5, and T6, For example, the second incompressible liquid layers 5b are optionally disposed at positions corresponding to the transistors T1, T5, and T6. Furthermore, the second incompressible liquid layer 5b can be optionally disposed at the position corresponding to the transistor T1.

In addition, in some embodiments, the shapes or the locations of the first incompressible liquid layer 5a and the second incompressible liquid layer 5b do not completely overlap each other. For example, the first incompressible liquid layer 5a can have a shape such as rectangular overlapping almost the entire pixel area PX, and the second incompressible liquid layers 5b can have a shape such as rectangular and can optionally be disposed corresponding to each of the transistors T1, T2, T3, T4, T5, and T6.

In the present exemplary embodiment, the second incompressible liquid layer 5b is disposed in the interlayer insulating layer 160, but according to exemplary embodiments, the second incompressible liquid layer 5b can be disposed in the passivation layer 180 or in both of the passivation layer 180 and the interlayer insulating layer 160. Further, one of the first incompressible liquid layer 5a and the second incompressible liquid layer 5b can be omitted.

Hereinafter, the OLED display according to the exemplary embodiment will be described with reference to FIGS. 13 to 16. The detailed descriptions of the same constituent elements of the LCD according to the exemplary embodiment described with reference to FIGS. 1 to 5 are omitted.

Figure 13:
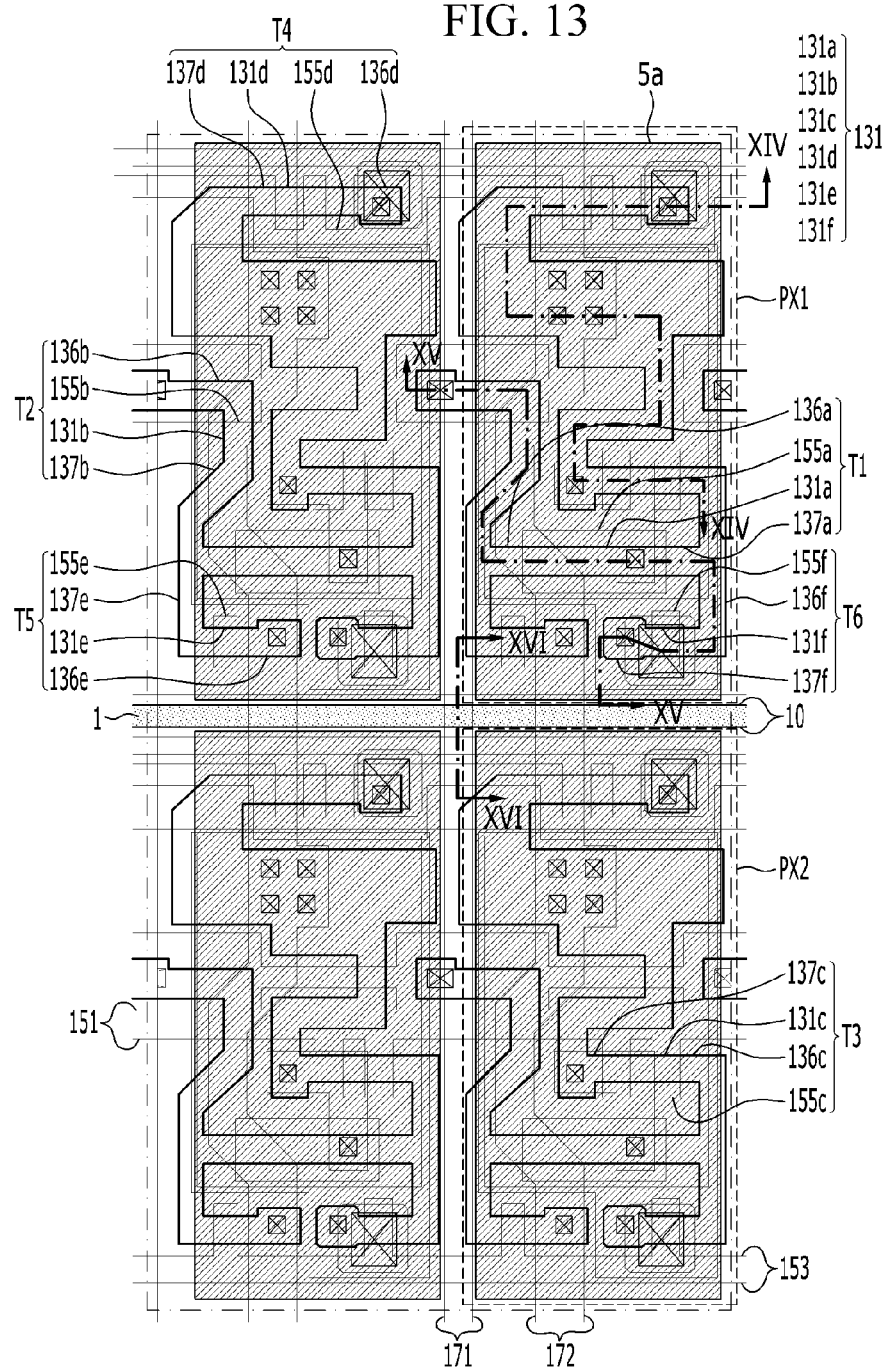
FIG. 13 is a layout view of a plurality of transistors and a plurality of capacitors which are formed in a plurality of pixel areas of an OLED display according to an exemplary embodiment of the present disclosure.
Figure 14:
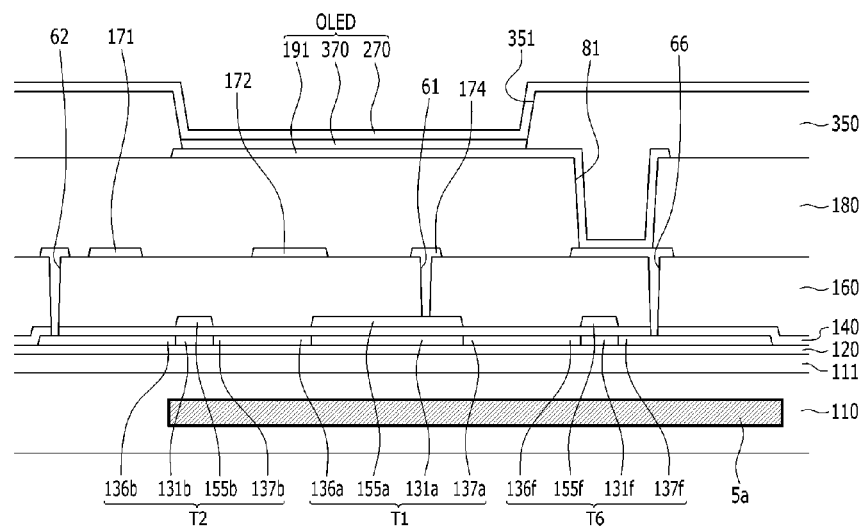
FIG. 14 is a cross-sectional view of the OLED display of FIG. 13 taken along line IV-IV.
Figure 15:
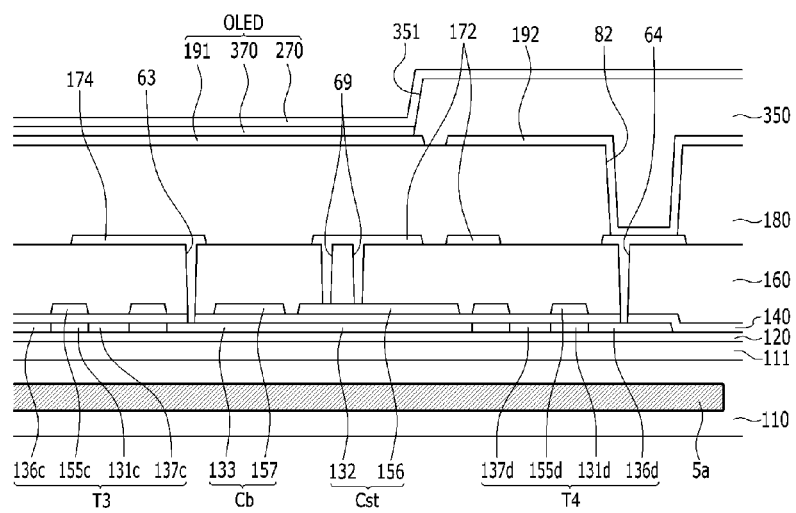
FIG. 15 is a cross-sectional view of the OLED display of FIG. 13 taken along line XV-XX.
Figure 16:
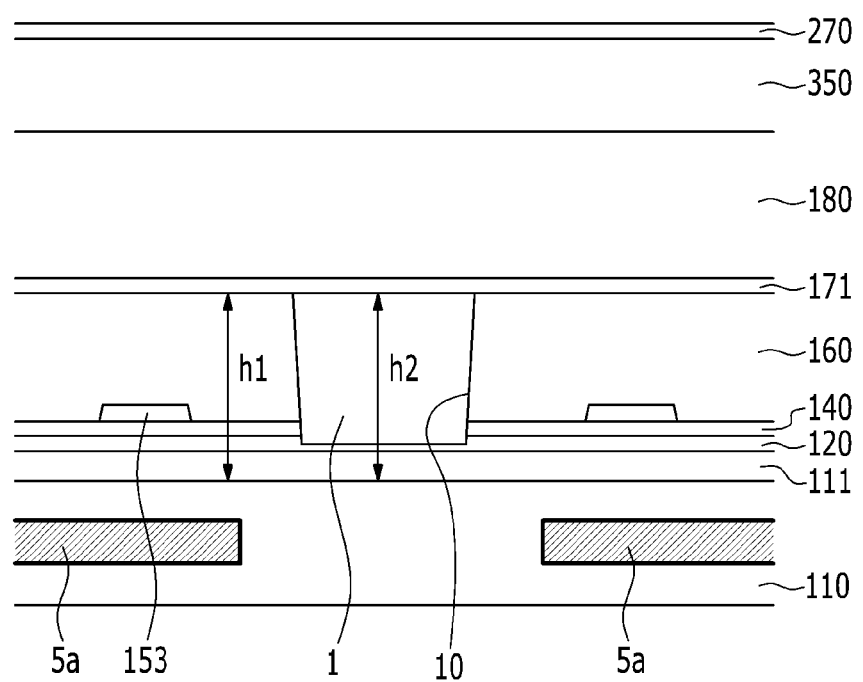
FIG. 16 is a cross-sectional view of the OLED display of FIG. 13 taken along line XVI-XVI.

FIG. 13 is a layout view of plurality of transistors and plurality of capacitors which are formed in a plurality of pixel areas of an OLED display according to an exemplary embodiment of the present disclosure. FIG. 14 is a cross-sectional view of the OLED display of FIG. 13 taken along line XIV-XIV. FIG. 15 is a cross-sectional view of the OLED display of FIG. 13 taken along line XV-XV. FIG. 16 is a cross-sectional view of the OLED display of FIG. 13 taken along line XVI-XVI.

First incompressible liquid layers 5a are disposed at a position in the substrate 110 corresponding to each of the pixel areas PX, respectively. In the present exemplary embodiment, the first incompressible liquid layer 5a has a shape such as rectangular overlapping almost the entire pixel area PX, but the first incompressible liquid layer 5a is not limited to the rectangular shape, and can also have a shape such as circular or polygonal. Also, since the first incompressible liquid layer 5a is used for reducing strain of the configuration of the display device such as thin film transistors, as necessary, the first incompressible liquid layer 5a can be optionally disposed at positions where the strain needs to be reduced. The first incompressible liquid layer 5a can have a stripe pattern, a matrix pattern, etc., but the patterns are not limited to a certain pattern.

In the present exemplary embodiment, the first incompressible liquid layer 5a is disposed in the substrate 110, but according to exemplary embodiments, the first incompressible liquid layer 5a can be disposed in the passivation layer 180 or in the interlayer insulating layer 160. Further, the first incompressible liquid layer 5a can be disposed in more than two layers.

A separation groove 10 that separates two pixel areas PX1 and PX2 that are adjacent to each other from each other is formed in the direction perpendicular to the data line 171 on the interlayer insulating layer 160, the gate insulating layer 140, the buffer layer 120, and the barrier film 111. For example, the separation groove 10 is formed between the light emission control line 153 of the first pixel area PX1 and the previous scan line 152 of the second pixel area PX2. The data line 171 and the driving voltage line 172 traverse the separation groove 10 and a filling member 1. The filling member 1 is filled in the separation groove 10. The separation groove 10 extends in the same direction as the extending direction of the scan line 151, and the filling member 1 is filled in the extending direction of the separation groove 10. In this case, a height h1 from an upper surface of the substrate 110 to an upper surface of the interlayer insulating layer 160 can be the same as a height h2 from the upper surface of the substrate 110 to an upper surface of the filling member 1.

The filling member 1 can include an elastic material, and the elastic material can include an organic material or a viscoelastic material. As an example of the viscoelastic material, a pressure sensitive adhesive (PSA) which is a material which can be easily deformed according to stress can be included.

Young's modulus of the filling member 1 can be smaller than Young's modulus of the interlayer insulating layer 160, the gate insulating layer 140, the buffer layer 120, and the barrier film 111.

As such, the separation groove 10 is formed between two adjacent pixel areas PX1 and PX2, and thus the pixel areas PX1 and PX2 of the OLED display can form an island-type structure, respectively. Accordingly, when the OLED display is curved, folded, or rolled, stress generated in the pixel areas PX1 and PX2 of the OLED display is distributed to prevent damage to the pixel areas PX1 and PX2. Accordingly, on a plane, generation of the stress in the pixel areas PX1 and PX2 positioned on and below the filling member 1 is minimized, thereby preventing the damage to the pixel areas PX1 and PX2.

Since the height h1 from the upper surface of the substrate 110 to the upper surface of the interlayer insulating layer 160 is the same as the height h2 from the upper surface of the substrate 110 to the upper surface of the filling member 1, the data line 171 and the driving voltage line 172 straightly pass the filling member 1 without bending. Accordingly, since the entire path of the data line 171 and the driving voltage line 172 that straightly pass across the top of the filling member 1 is shortened, resistance of the data line 171 and the driving voltage line 172 can be reduced.

Further, since the data metal layer is formed on the filling member 1 without bending, in the case of patterning the data metal layer to form the data line 171 and the driving voltage line 172 by performing the photolithography process, the data metal layers between the data line 171 and the driving voltage line 172 can be removed. Accordingly, since there is no remaining data metal layer which is not etched between the data line 171 and the driving voltage line 172, the data line and the driving voltage line are disconnected from each other to prevent current leakage passage.

Further, since a distance between the light emission control line 153 and the previous scan line 152 which are the gate wires adjacent to the separation groove 10 and the data line 171 or the driving voltage line 172 is increased by filling the separation groove 10 with the filling member 1, disconnection between the light emission control line 153 and the previous scan line 152 and the data line 171 or the driving voltage line 172 can be prevented.

Meanwhile, in the exemplary embodiment, the separation groove 10 and the filling member 1 are formed between the pixel areas formed in all regions of the substrate 100, but another exemplary embodiment in which the separation groove 10 and the filling member 1 are formed only between the pixel areas formed at a bending part which is bent in the substrate is possible.

If the OLED display includes the filling member 1 and the first incompressible liquid layer 5a, the mechanical strength difference between the filling member 1 and the island-type structure becomes higher when the first incompressible liquid layer 5a is disposed in the island type structure. As the mechanical strength difference between the filling member 1 and the island-type structure becomes larger, the rigidity of the island-type structure becomes larger and this reduces the strain rate of the island-type structure.

Therefore, even if the curved display device is modified when bending, thin film transistors can maintain stable performance. Furthermore, the superior quality of the display device is maintained.

Hereinafter, the OLED display according to the exemplary embodiment will be described with reference to FIGS. 17 to 21. The detailed descriptions of the same constituent elements of the LCD according to the exemplary embodiment described with reference to FIGS. 1 to 5 are omitted.

FIG. 17 to FIG. 21 are drawings showing a manufacturing method of an OLED display according to an exemplary embodiment of the present disclosure in order.

Figure 17:
FIGS. 17, 18, 19, 20 and 21 are drawings showing a manufacturing method of an OLED display according to an exemplary embodiment of the present disclosure in order.

First, as shown in FIG. 17, a first layer 110a including an organic material selected from a group consisting of thin glass, polyethersulfone (PES), polyacrylate, (PAR), polyetherimide (PEI), polyethylene naphthalate (PEN), polyethylene terephthalate (PET), polyphenylene sulfide (PPS), polyarylate (PA), polyimide (PI), polycarbonate (PC), triacetate cellulose (TAC), and cellulose acetate propionate (CAP) is prepared.

Figure 18:
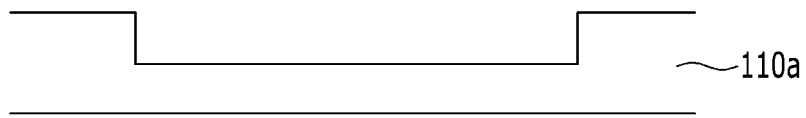

Next, as shown in FIG. 18, positions of the first layer 110a which need to reduce the strain are etched. For example, the first layer 110a is etched with a substantially rectangular shape overlapping most of one pixel area PX. However, the shape of the etched first layer 110a is not limited to the rectangular shape, and can also have a shape such as circular or polygonal. Since the first incompressible liquid layer 5a reduces strain of the configuration of a display device such as a thin film transistor, as necessary, the position of the first layer 110a which reduces the strain can be optionally etched. The first layer 110a can be etched as a stripe pattern, a matrix pattern, and so on, such that the patterns are not limited to a certain pattern. The position of the first layer 110a corresponding to the thin film transistor can be etched.

Figure 19:
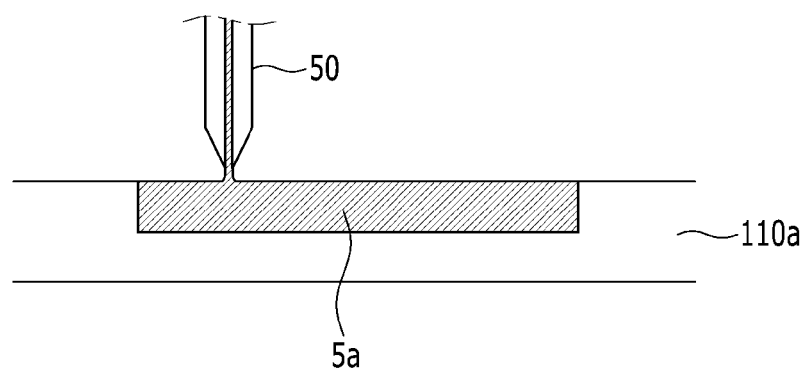

Next, as shown in FIG. 19, the first incompressible liquid layer 5a is formed by injecting an incompressible liquid to the etched portion. Since most liquids are incompressible, the incompressible liquid is not limited to certain material. Any liquid which is incompressible, such as $H_2O$ and so on, can be used as a raw material of the first incompressible liquid layer 5a.

The incompressible liquid can be injected by an injection printing process. The first incompressible liquid layer 5a is formed by aligning an incompressible liquid injector 50 with the etched portion and injecting the incompressible liquid to the etched portion through the incompressible liquid injector 50. While the present exemplary embodiment has been described with respect to the injection printing process, a slit coating process can be used to inject the incompressible liquid, and any process which can inject the incompressible liquid can be used to inject the incompressible liquid.

Figure 20:
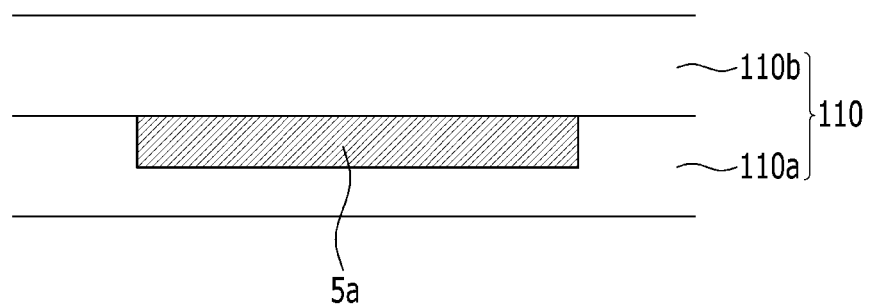

Next, as shown in FIG. 20, a substrate 110 is completed by laminating a second layer 110b including an organic material selected from a group consisting of thin glass, polyethersulfone (PES), polyacrylate, (PAR), polyetherimide (PEI), polyethylene naphthalate (PEN), polyethylene terephthalate (PET), polyphenylene sulfide (PPS), polyarylate (PA), polyimide (PI), polycarbonate (PC), triacetate cellulose (TAC), and cellulose acetate propionate (CAP) on the first layer 110 including the incompressible liquid layer 5a.

Figure 21:
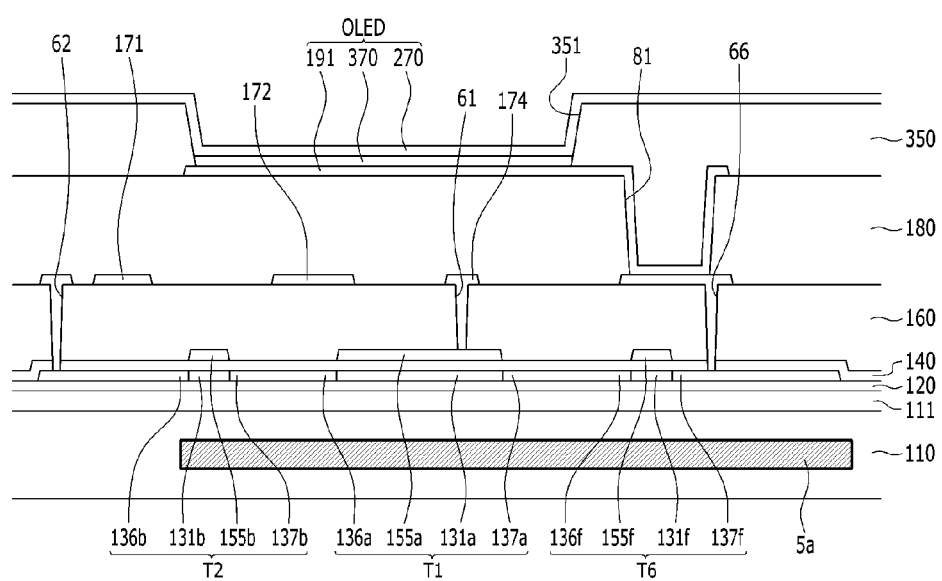

Next, as shown in FIG. 21, the OLED display is completed by sequentially laminating the thin film transistor, the data line 171, the passivation layer 180, the pixel electrode 191, the organic emission layer 370, and the common electrode 270 on the substrate 110 formed through the above processes.

In the present exemplary embodiment, the method with respect to forming the first incompressible liquid layers 5a in the substrate 110 is mainly explained, but according to exemplary embodiments, the first incompressible liquid layer 5a can be formed in the interlayer insulating layer 160 or in the passivation layer 180, and in this case, the method with respect to forming the first incompressible liquid layers 5a in the substrate 110 can also be used. That is, the manufacturing method of a display device can include a step of forming a thin film transistor on the substrate 110, a step of forming a first insulating layer on the thin film transistor, a step of etching the first insulating layer, a step of injecting an incompressible liquid in the etched portion of the first insulating layer by the injection printing process, the slit coating process, and so on, or a step of forming a second insulating layer on the first insulating layer.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a flexible substrate;
   a thin film transistor (TFT) disposed over the flexible substrate;
   a first electrode disposed over the TFT; and
   a second electrode disposed over the first electrode,
   wherein the flexible substrate comprises a first incompressible liquid layer.

2. The display device of claim 1, further comprising a plurality of pixel areas comprising the first electrode, wherein the first incompressible liquid layer is disposed in one of the pixel areas.

3. The display device of claim 1, wherein the first incompressible liquid layer is disposed over the TFT.

4. The display device of claim 1, further comprising an organic emission layer disposed between the first and second electrodes.

5. The display device of claim 4, further comprising one or more insulating layers disposed over the flexible substrate, wherein at least one of the insulating layers comprises a second incompressible liquid layer.

6. The display device of claim 5, further comprising a plurality of pixel areas comprising the first electrode, wherein the first and second incompressible liquid layers are disposed over one of the pixel areas.

7. The display device of claim 5, wherein the first and second incompressible liquid layers are disposed over the TFT.

8. The display device of claim 7, wherein the first incompressible liquid layer is disposed over the second incompressible liquid layer.

9. The display device of claim 6, further comprising a data line connected to the TFT and extending in a first direction, wherein the insulating layers comprise a passivation layer disposed over the data line and an insulating layer disposed below the data line, and wherein at least one of the passivation layer and the insulating layer comprise the second incompressible liquid layer.

10. The display device of claim 9, wherein the insulating layer comprises a plurality of separation grooves that separate adjacent pixel areas and extend in a second direction crossing the data line, and wherein the separation groove is filled with a filling member.

11. The display device of claim 10, wherein the display device is bent in the first direction.

12. The display device of claim 11, wherein the flexible substrate is formed of a polyimide.

13. The display device of claim 12, wherein the passivation layer comprises the second incompressible liquid layer, and wherein the second incompressible liquid layer comprises one or more patterns corresponding to a contact hole formed in the passivation layer.

14. The display device of claim 12, wherein the insulating layer comprises the second incompressible liquid layer, and wherein the second incompressible liquid layer comprises one or more patterns corresponding to a contact hole formed in the passivation layer.

15. A display device comprising:
a flexible substrate;
a thin film transistor (TFT) disposed over the flexible substrate;
an insulating layer disposed over the TFT;
a first electrode disposed over the insulating layer; and
a second electrode disposed over the first electrode,
wherein the insulating layer comprises a first incompressible liquid layer.

16. The display device of claim 15, further comprising a plurality of pixel areas comprising the first electrode, wherein the first incompressible liquid layer is disposed over one of the pixel areas.

17. The display device of claim 15, wherein the first incompressible liquid layer is disposed over the TFT.

* * * * *